United States Patent [19]

Mogi

[11] 4,127,818
[45] Nov. 28, 1978

[54] METHOD OF AND APPARATUS FOR TUNING AN AFT-CONTROLLED ELECTRONIC TUNER TO A DESIRED FREQUENCY

[75] Inventor: Takao Mogi, Tokyo, Japan
[73] Assignee: Sony Corporation, Tokyo, Japan
[21] Appl. No.: 740,753
[22] Filed: Nov. 10, 1976
[30] Foreign Application Priority Data
Nov. 20, 1975 [JP] Japan .................. 50-139513
[51] Int. Cl.$^2$ .............................................. H04B 1/16
[52] U.S. Cl. .................................... 325/418; 325/464
[58] Field of Search ................................ 325/418–423, 325/453, 457, 464, 465, 468, 470; 358/191, 195

[56] References Cited

U.S. PATENT DOCUMENTS

| 3,889,193 | 6/1975 | Sasaki et al. | 325/422 |
|---|---|---|---|
| 3,906,351 | 9/1975 | Evans | 325/464 |
| 3,906,372 | 9/1975 | Schatter et al. | 325/464 |
| 3,968,440 | 7/1976 | Ehni | 325/464 |
| 3,988,681 | 10/1976 | Schurmann | 325/470 |
| 4,004,231 | 1/1977 | Elshuber et al. | 325/464 |

*Primary Examiner*—Robert L. Griffin
*Assistant Examiner*—Jin F. Ng
*Attorney, Agent, or Firm*—Lewis H. Eslinger; Alvin Sinderbrand

[57] ABSTRACT

A method of and apparatus for tuning an electronic tuner of the type having a voltage-controlled tuning element to which a selected control voltage is applied, thereby tuning the electronic tuner to a corresponding frequency, the tuner additionally including an automatic fine tuning circuit which is operable even when a control voltage first is applied to the voltage-controlled tuning element. When the control voltage first is applied, generally it experiences a gradual increase in magnitude until its predetermined control voltage level is attained. The automatic fine tuning circuit may pull in a frequency corresponding to the instantaneous level of the control voltage during the gradual increase in magnitude thereof. To avoid tuning the electronic tuner to this pulled-in frequency, the selected control voltage is re-applied to the tuning element at a predetermined time subsequent to the initial application of such control voltage.

In a preferred embodiment, the electronic tuner is a programmable tuner provided with a storage device wherein representations, such as digital representations, of desired frequencies are stored. The tuner is tuned to one of these frequencies by reading out a selected representation, converting the representation to a corresponding control voltage and then applying this voltage to the voltage-controlled tuning element. The automatic fine tuning operation serves to modify the read-out representation, and thus the converted control voltage, to correspond to a pulled-in frequency. The selected control voltage is re-applied to the tuning element by reading out once again the selected representation from the storage device.

18 Claims, 20 Drawing Figures

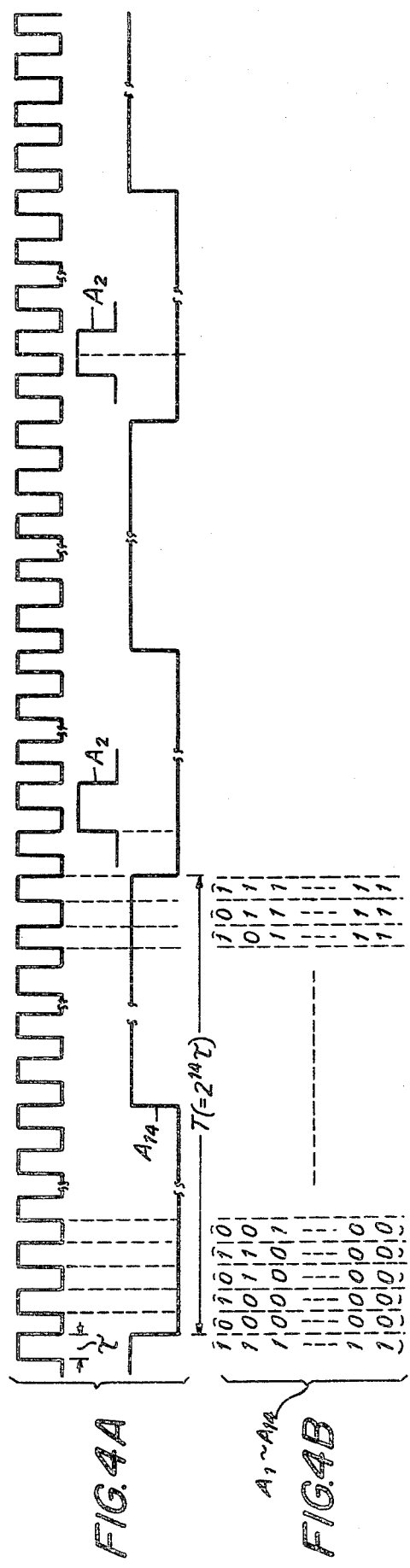
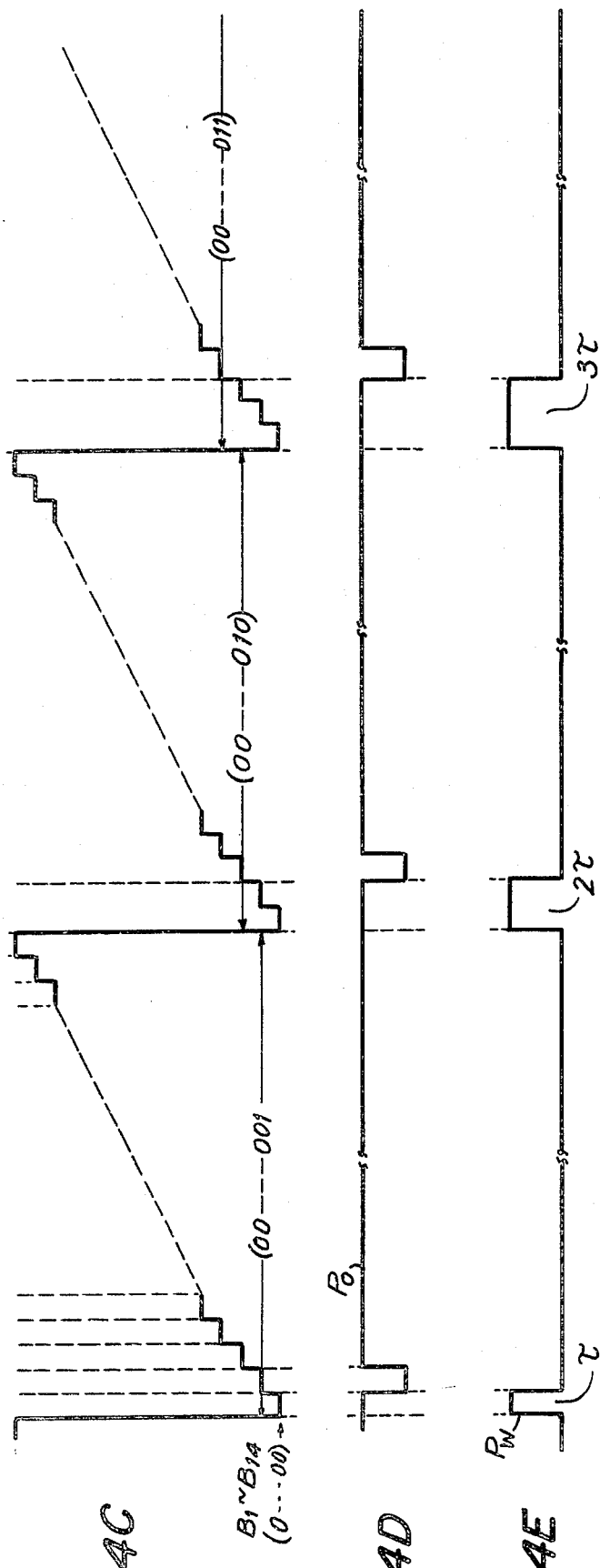

FIG.7
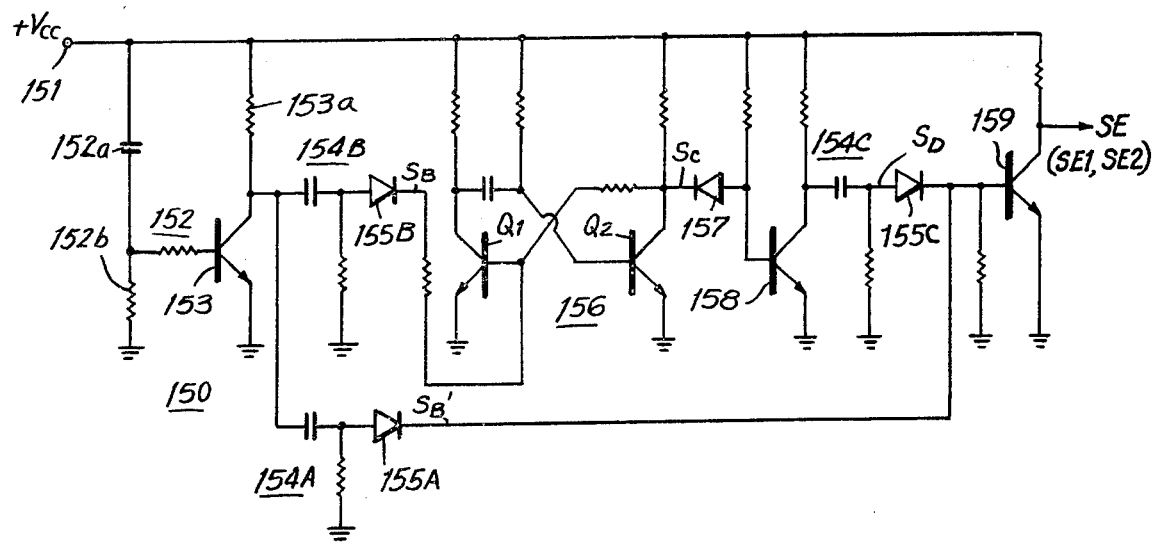
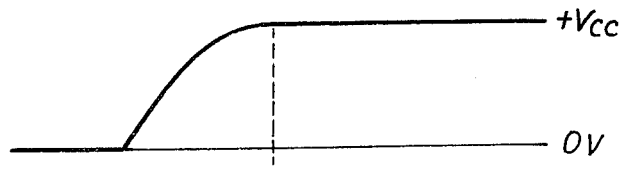
FIG.8A
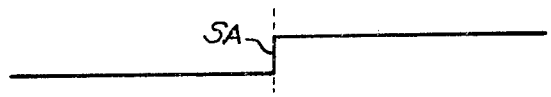
FIG.8B
FIG.8C
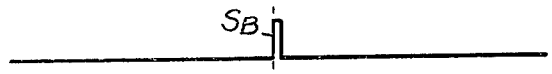
FIG.8D
FIG.8E
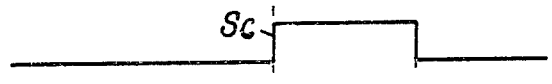
FIG.8F
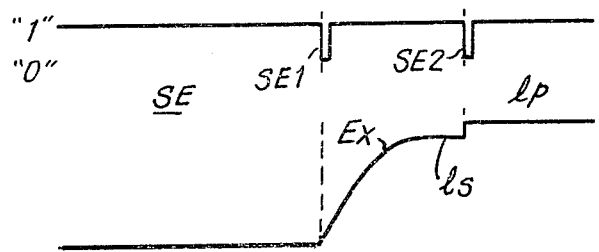
FIG.8G

METHOD OF AND APPARATUS FOR TUNING AN AFT-CONTROLLED ELECTRONIC TUNER TO A DESIRED FREQUENCY

BACKGROUND OF THE INVENTION

This invention relates to an electronic tuner and, more particularly, to a method of and apparatus for tuning such an electronic tuner to a preselected frequency even while an automatic fine tuning (AFT) operation is being performed.

Electronic tuners, such as a tuner used to select a particular channel in a television receiver or to select a particular station in, for example, an FM radio receiver, are known wherein a voltage-controlled tuning element, such as a varactor or variable capacitance diode, is supplied with a selected control voltage. The tuning element, which generally is a variable reactance device, exhibits a particular reactance representing the channel or station to which the tuner is to be tuned in accordance with the magnitude of the control voltage applied thereto.

An electronic tuner with such a voltage-controlled tuning element can, advantageously, be subjected to an AFT operation. Typically, this operation is performed by detecting the actual frequency to which the electronic tuner then is tuned, sensing the deviation between this instantaneous frequency and a predetermined frequency, and then adjusting the control voltage applied to the voltage-controlled tuning element in a direction to pull in the predetermined frequency. There are, however, some disadvantages attending the use of an AFT-controlled electronic tuner in a television receiver. For example, if the tuning condition of a television receiver is to be changed from a channel having a lower carrier frequency, such as channel 2, to a channel having a higher carrier frequency, such as channel 5, there is the possibility that as the magnitude of the applied control voltage increases, the AFT operation may pull in an unwanted channel whose carrier frequency lies between the lower and higher channel frequencies. That is, as the control voltage magnitude increases, it may, at some point, have an instantaneous magnitude corresponding to channel 3 or channel 4, and the AFT operation may pull in this channel. Similarly, if the television receiver is pre-conditioned to be tuned to a predetermined channel when the power supply for the electronic tuner first is energized, the AFT operation may pull in an unwanted channel, or tune the tuner to an unwanted frequency, while the power supply operating voltage, and thus the tuner-controlling voltage, increases. This possibility of pulling in an erroneous frequency is further complicated by the fact that, in typical television signal transmissions, the video information for a particular channel is modulated onto one carrier frequency and the audio information for that same channel is modulated onto a higher carrier frequency. Consequently, the AFT operation may lock the electronic tuner onto the sound information carrier frequency of an adjacent, lower channel.

It has been proposed that this erroneous pull-in result can be avoided by completely suppressing or stopping the AFT operation for a certain duration of time after the tuner power supply first is energized, as described in U.S. Pat. No. 3,806,817. However, since the AFT operation generally is a slow, or low frequency, technique, it is preferred not to suppress or stop it, especially when the AFT circuit is used with a programmable type of electronic tuner, such as that disclosed in copending application Ser. No. 716,655, filed Aug. 23, 1976, now U.S. Pat. No. 4,085,371 issued Apr. 18, 1978, and assigned to the assignee, of the present invention. In such a programmable type of electronic tuner, various representations, such as digital representations, of individual VHF and/or UHF channels are stored. A selected representation is read out of an addressed storage location and is converted into a control voltage for application to the voltage-controlled tuning element. In this type of electronic tuner, it is best to provide for substantially continuous AFT operation even when the power supply first is energized.

OBJECTS OF THE INVENTION

Therefore, it is an object of the present invention to provide an improved method and apparatus for tuning an AFT-controlled electronic tuner to a predetermined frequency.

Another object of this invention is to provide a method of and apparatus for preventing an AFT-controlled electronic tuner from being tuned, or pulled in, to an unwanted frequency.

A still further object of this invention is to provide a method of and apparatus for tuning an electronic tuner that is subjected to a substantially continuous AFT operation to a desired frequency when the tuner power supply first is energized, while preventing an unwanted frequency from being pulled in by the AFT operation.

An additional object of this invention is to provide an improved method of and apparatus for tuning an AFT-controlled electronic tuner to a desired frequency when the tuner first is energized, without suppressing or stopping the AFT operation during an initial energizing period.

Yet another object of this invention is to provide an improved method of and apparatus for correcting the frequency to which an AFT-controlled electronic tuner is tuned in the event that the AFT operation pulls in an unwanted frequency after the tuner power supply first is energized.

Various other objects, advantages and features of this invention will become readily apparent from the ensuing detailed description, and the novel features will be particularly pointed out in the appended claims.

SUMMARY OF THE INVENTION

In accordance with this invention, a method of and apparatus for tuning an AFT-controlled electronic tuner to a selected frequency when a power supply for the tuner first is energized is provided, wherein a selected control voltage is applied to a tuning element to tune the tuner to a corresponding frequency, the tuner being subjected to the AFT operation during the interval that the applied voltage increases to its selected level so that such applied voltage may be varied from its selected level in response to the AFT operation; and then reapplying the selected control voltage to the tuning element at a subsequent, predetermined time, so as to properly tune the electronic tuner to the desired frequency.

In a preferred embodiment, the electronic tuner is of the type wherein plural representations are stored in a storage device corresponding to the respective frequencies to which the tuner may be tuned. The control voltage is applied to the tuning element by reading out a selected representation and then converting it to a corresponding control voltage level. The AFT operation functions to vary the read-out representation, and thus the converted control voltage, so as to pull in a predetermined frequency. An erroneously pulled-in frequency is corrected by reading out once again the selected representation from the storage device and converting this re-read representation to the proper control voltage level.

BRIEF DESCRIPTION OF THE DRAWINGS

The following detailed description, given by way of example, will best be understood in conjunction with the accompanying drawings in which:

FIGS. 4A-4E are waveform diagrams that are helpful in explaining the operation of the electronic tuner shown in FIG. 1;

FIG. 7 is a schematic diagram illustrating a preferred embodiment of the correcting circuit used with the electronic tuner of FIG. 1 so as to prevent the AFT operation from pulling in an unwanted frequency; and FIGS. 8A-8G are waveform diagrams to which reference will be made in explaining the operation of the correcting circuit illustrated in FIG. 7.

DETAILED DESCRIPTION OF A PREFERRED EMBODIMENT

Although the technique of the present invention by which the pull-in of an unwanted frequency by an AFT operation is prevented can be used with various types of electronic tuners, it will be particularly described in the environment of a preferred electronic tuner that can be used in a television receiver and that can be programmed by a user to receive selected VHF and/or UHF frequencies.

Programmable Electronic Tuner

Figure 1:
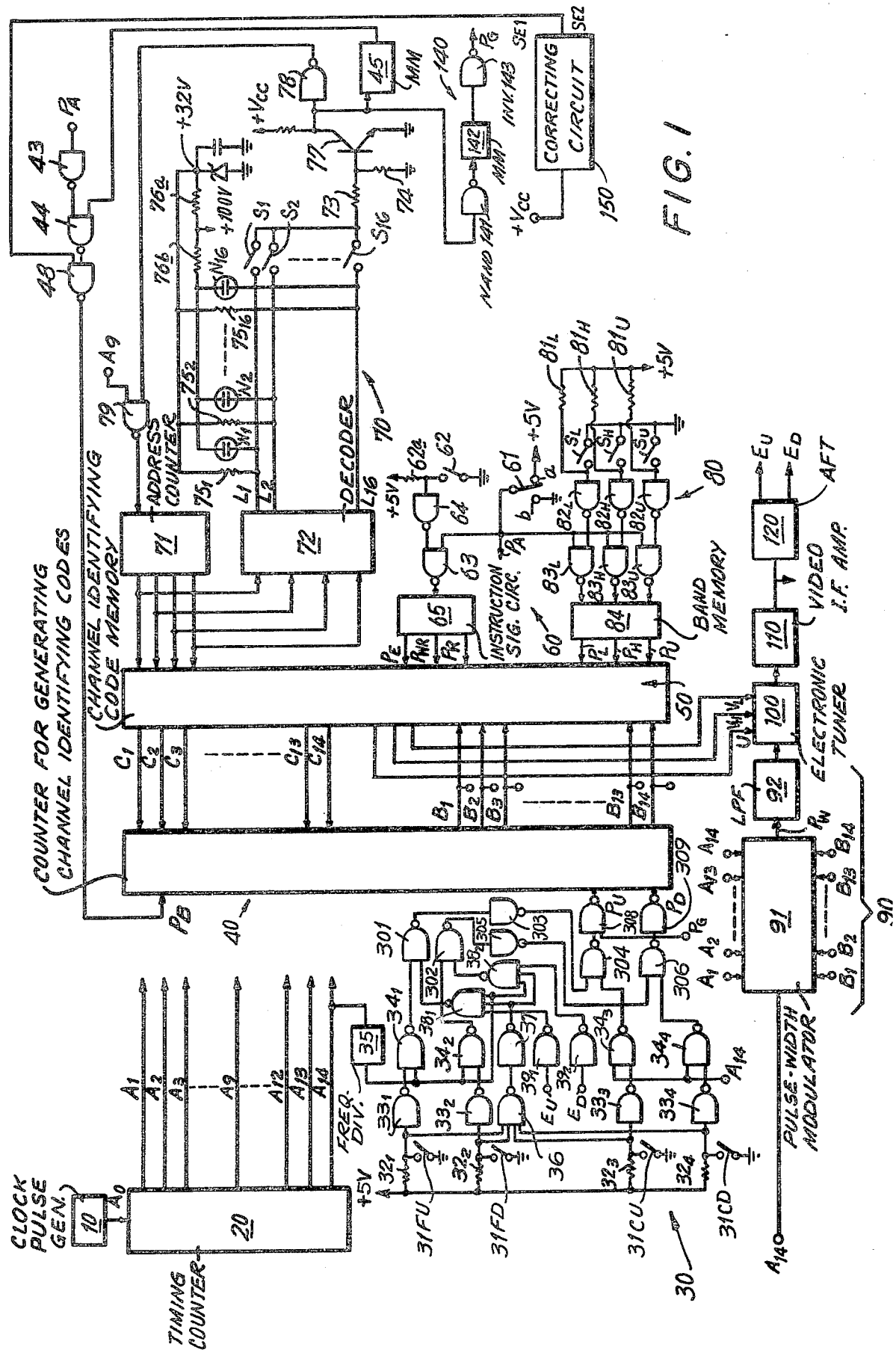
FIG. 1 is a block diagram illustrating one embodiment of an electronic tuner wherein the present invention finds ready application.

Referring to FIG. 1, one embodiment of channel selecting apparatus comprises a clock pulse generator 10 that supplies clock pulses $A_0$ to a timing counter 20, the timing counter being a conventional counter responsive to clock pulses $A_0$ to produce a recirculating timing code $A_1$, $A_2$, $A_3$, ... $A_{14}$. A sweep pulse generating circuit 30 is manually controllable to selectively produce up-sweep pulses $P_U$ or down-sweep pulses $P_D$ in response to timing pulses $A_{14}$ produced by timing counter 20. An up-down counter 40 is provided to count the sweep pulses $P_U$ or $P_D$ in a programming mode of the apparatus to establish channel identifying digital codes $B_1$, $B_2$, $B_3$, ... $B_{14}$ corresponding to the changing counts of counter 40. These channel identifying codes may be selectively written at selected addresses in a memory 50. A memory control circuit 60 is adapted to selectively establish the programming mode of operation or a channel selecting mode in which a previously programmed channel is selected, as by reading out a channel identifying digital code previously written or stored at a selected address in memory 50, as indicated at $C_1$, $C_2$, $C_3$, ... $C_{14}$, with such read out code being applied to counter 40 for setting the counter to this count. A manually controllable address selecting circuit 70 is adapted to activate a selected address in memory 50 either for the writing in of a selected channel identifying code at such address or the reading out from such address of a previously stored channel identifying code. A band indicating signal forming circuit 80 is operable in the programming mode of operation to produce a signal indicating the band of the channel indicating code then being written into a selected address of memory 50. The band indicating signal also is written into the respective address.

The channel selecting apparatus shown in FIG. 1 also includes a digital-to-analog converter 90 which provides an analog control voltage for the variable reactance device, such as a varactor, of a selected band in an electronic tuner 100 in correspondence to the count of counter 40 established by a channel identifying digital code selectively read out of memory 50 in a channel selecting mode of the apparatus, or in correspondence to the changing counts of counter 40 produced when the counter counts sweep pulses from generating circuit 30 in the programming mode of the apparatus. A video intermediate frequency amplifier 110 receives the tuned frequency output of tuner 100 and operates in typical manner to supply its output to a video detector circuit (not shown).

The output of IF amplifier 110 also is supplied to an automatic fine tuning (AFT) circuit 120 for discriminating, or detecting, the deviation between the carrier in the IF output and a predetermined carrier frequency to produce an AFT voltage from which outputs $E_U$ and $E_D$ are derived, as will be described below. These outputs indicate that the channel identifying digital code in counter 40 should be incremented or decremented so as to correspondingly vary the analog control voltage in a direction whereby the tuned frequency output of tuner 100 is corrected to attain the precise predetermined carrier frequency. This results in properly tuning the electronic tuner to a correct broadcast channel.

Outputs $E_U$ and $E_D$ are applied to sweep pulse generating circuit 30 for providing sweep pulses that are counted by counter 40. Hence, the channel identifying code applied by the counter to converter 90 is modified to correct the frequency to which the tuner then is tuned, for achieving a desired AFT operation.

An AFT inhibit circuit 140 is provided to prevent the AFT operation for a brief duration during operation of address selecting circuit 70, as will be described below.

In the channel selecting apparatus as generally described above, the clock pulse $A_0$ from generator 10 may have a frequency of, for example, 4 MHz resulting in a period $\tau$ of $0.25\mu$ sec. In the timing counter 20, clock pulses $A_0$ are counted to produce timing pulses $A_1$ to $A_{14}$. The frequency of a given timing pulse is onehalf its preceding pulse so that a sequence of frequency-halved pulses range from the pulses $A_1$ having a period of $0.5\mu$ sec. and a pulse width of $0.25\mu$ sec., to the pulses $A_{14}$ having a period of 4.096 m.sec. and a pulse width of 2.048 m.sec. The timing pulses $A_1$, $A_2$, ... $A_{14}$ thus form a 14-bit recirculating timing code. It will be apparent that such 14-bit circulating digital code changes its state $2^{14}$ times, that is, 16,384 times, within the recirculating or timing period of $T = 2^{14} = 4.096$ m.sec., as depicted in FIGS. 4A and 4B.

In the sweep pulse generating circuit 30 as shown in FIG. 1, a fine up-sweep switch 31FU, a fine down-sweep switch 31FD, a coarse up-sweep switch 31CU and a coarse down-sweep switch 31CD are connected in series circuits with respective resistors $32_1$, $32_2$, $32_3$ and $32_4$, and such series circuits are connected in parallel between a voltage source and ground. The switches 31FU, 31FD, 31CU and 31CD are normally open, as shown, to provide signals at the relative high level, hereinafter used to designate a binary "1", at the junctions of such switches with the respective resistors $32_1$, $32_2$, $32_3$ and $32_4$. Further, the switches 31FU, 31FD, 31CU and 31CD are adapted to be selectively manually displaced to the closed condition thereof for providing a signal at the low level, hereinafter used to designate a binary "0," at the junction of the closed switch with the respective resistor $32_1$–$32_4$. Such binary signals "1" or "0" from switches 31FU, 31FD, 31CU and 31CD are applied through inverters $33_1$, $33_2$, $33_3$ and $33_4$, respectively. The binary pulses $A_{14}$ having a period of 4.096 m.sec. are applied from timing counter 20, as coarse sweep pulses, to second inputs of NAND circuits $34_3$ and $34_4$. These timing pulses $A_{14}$ also are applied to a frequency divider 35 so as to be divided, for example, by 64, for providing fine sweep pulses having a period of 262.144 m.sec. and such fine sweep pulses are applied to second inputs of NAND circuits $34_1$ and $34_2$.

The binary signals "1" or "0" from switches 31FU, 31FD, 31CU and 31CD are also all applied to a NAND circuit 36 which has its output connected through an inverter 37 to provide a binary "1" when none of these switches is closed, or a binary "0" when any one switch is closed, which is, in turn, applied to NAND circuits $38_1$ and $38_2$. The NAND circuits $38_1$ and $38_2$ both also have applied thereto the fine sweep pulses from frequency divider 35. Further, the discriminated outputs $E_U$ and $E_D$ from AFT circuit 120 are applied through inverters $39_1$ and $39_2$, respectively, to NAND circuits $38_1$ and $38_2$. The outputs of NAND circuits $34_1$ and $38_1$ are applied to a NAND circuit 301, while the outputs of NAND circuits $34_2$ and $38_2$ are similarly applied to a NAND circuit 302. The output of NAND circuit 301 is applied through an inverter 303 to one input of a NAND circuit 304 which also receives at its other input the output of NAND circuit $34_3$; and the output of NAND circuit 302 is similarly applied through an inverter 305 to one input of a NAND circuit 306 which also receives at its other input the output of NAND circuit $34_4$. The outputs of NAND circuits 304 and 306 are respectively applied through NAND circuits 308 and 309, which are conditioned or inhibited by an AFT inhibit pulse $P_G$ from circuit 140, to apply up-sweep pulses $P_U$ and down-sweep pulses $P_D$, respectively, to counter 40.

Figure 2:
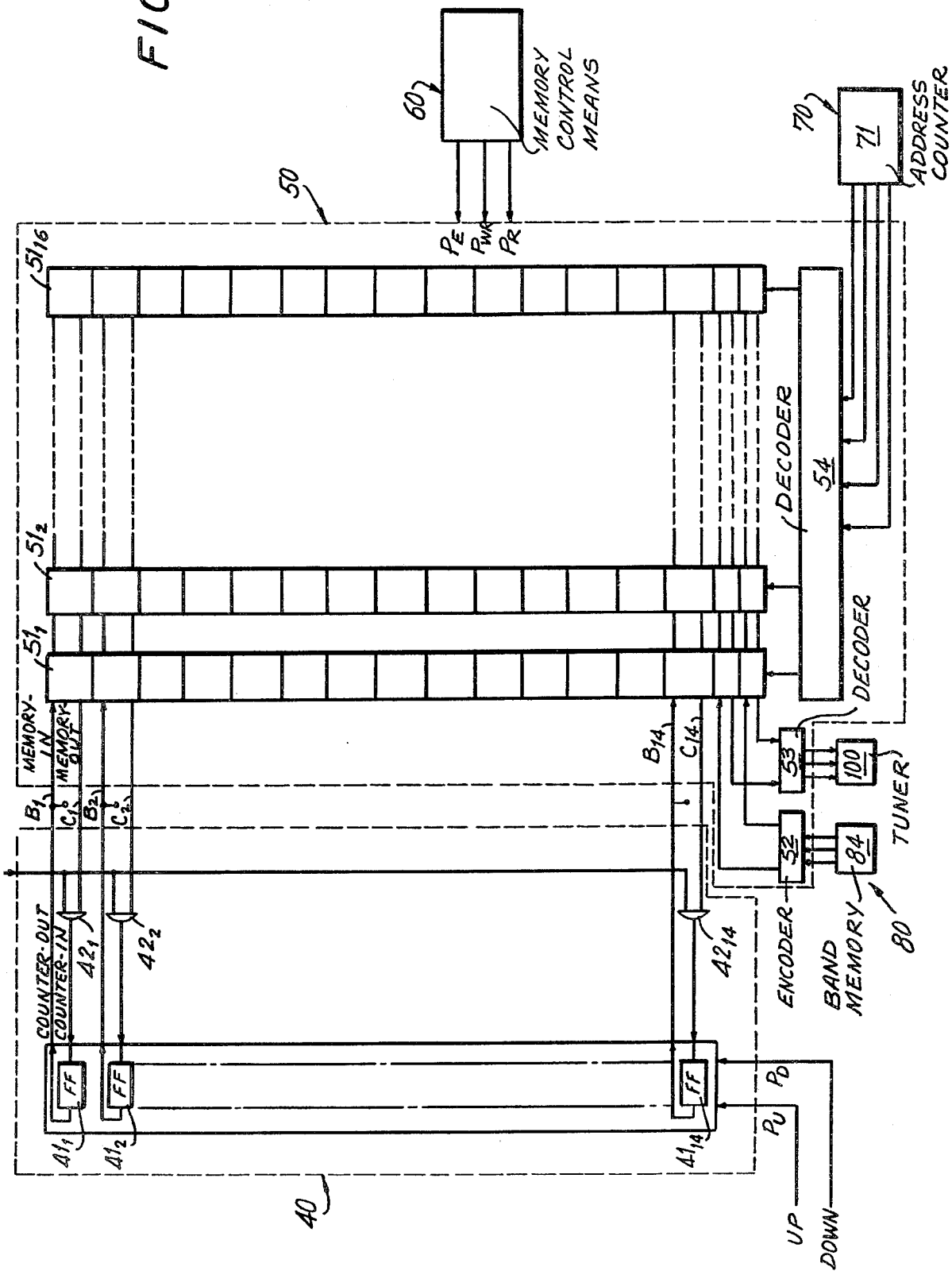
FIG. 2 is a block diagram illustrating, in greater detail, a portion of the electronic tuner of FIG. 1.

As shown schematically in FIG. 2, counter 40 may be a conventional 14-bit up-down counter having 14 flip-flops $41_1$, $41_2$, ... $41_{14}$ whose states are changed sequentially in the up or down direction when counting the up-sweep pulses $P_U$ or the down-sweep pulses $P_D$, respectively, in the programming mode of operation. These changing states establish the respective bits of sequentially changing 14-bit channel identifying codes $B_1$, $B_2$, ... $B_{14}$. In the programming mode of operation, the channel identifying codes are applied from counter 40 to memory 50 for writing or storage of a selected one of such codes at a selectively activated address in the memory, and the channel identifying codes are also applied from counter 40 to digitial-to-analog converter 90 for providing a corresponding control voltage for the varactor in a selected band of electronic tuner 100. Flip-flops $41_1$–$41_{14}$ of counter 40 are further adapted, in the channel selecting mode of operation, to have their respective states established by the respective bits $C_1$–$C_{14}$ of a stored channel identifying code which is read out from a selectively activated address in memory 50 through AND circuits $42_1$–$42_{14}$ when these AND circuits are energized by a load pulse $P_B$ during the channel selecting operation.

As also shown in FIG. 2, memory 50 may be formed of sixteen addressable memory units, or registers, $51_1$, $51_2$, ... $51_{16}$ with the memory at each address being capable of storing 16-bits of digital information, that is, the 14-bits of a selected channel identifying code as determined by counter 40 and 2-bits from an encoder 52 for the band indicating signal received from circuit 80 for indicating whether the channel identified by the 14-bit digital code is a VHF or UHF channel, and, if it is a VHF channel, whether it is a low channel or a high channel in such broadcast band, respectively. Further, the memory 50 is schematically shown to include a decoder 53 which, in the programming and channel selecting modes of operation, receives the 2-bits of digital information representing the band of the channel identified by the 14-bit code that is being written into or read out of the addressed unit 51, to apply a corresponding band identifying signal to electronic tuner 100 for selecting the corresponding VHF or UHF band. Finally, the memory 50 is schematically shown to include a decoder 54 which receives a 4-bit digital code from address selecting circuit 70, as hereinafter described, to address one memory unit $51_1$, $51_2$, ... $51_{16}$ corresponding to the 14-bit address code. Preferably, the memory units of memory 50 are composed of non-volatile cells, such as metal-nitride-oxide-silicon (MNOS) elements, so that the contents thereof, while being electrically alterable, are held unchanged during periods when memory 50 is disconnected from a source of power.

Returning again to FIG. 1, memory control 60 includes a mode change-over switch 61 having a movable contact that is manually actuable to selectively engage fixed contacts $a$ and $b$. Fixed contact $a$ is connected to a voltage source +5V so that, when the movable contact engages contact $a$, the programming mode of operation is established and a signal $P_A$ that is a binary "1" is obtained from switch 61. On the other hand, the fixed contact $b$ of switch 61 is connected to ground so that, when the movable contact engages contact $b$, the channel selecting mode of operation is established and a signal $P_A$ that is a binary "0" is obtained. Memory control 60 further includes a normally open switch 62 which is connected in series with a resistor 62a between a voltage source +5V and ground. The signal $P_A$ from mode change-over switch 61 is shown to be applied to one input of a NAND circuit 63 which has its other input connected through an inverter 64 to switch 62. When switch 62 is in its normally open position, as shown, inverter 64 will produce a binary "0," whereas, when switch 62 is manually closed to effect a write-in operation in the programming mode, inverter 64 will produce a binary "1." The output of NAND circuit 63 is applied to an instruction signal forming circuit 65 which is responsive to a binary "0" to supply an erasing pulse $P_E$ followed by a write-in pulse $P_{WR}$ to the particular memory unit that is being addressed in memory 50 so as to erase the previously stored contents in the addressed memory unit and, thereafter, to write into the addressed memory unit the 14-bit channel identifying code then being received from counter 40 plus the 2-bit code representing the band of the channel identified by the 14-bit code. Instruction signal forming circuit 65 is responsive to a binary "1" supplied by NAND circuit 63 to apply a read pulse $P_R$ to memory 50 so as to effect the read out of the contents stored in the memory unit which then is being addressed.

Band indicating signal forming circuit 80 includes normally open switches $S_L$, $S_H$ and $S_U$ which are connected in series with respective resistors $81_L$, $81_H$ and $81_U$ between a voltage source +5V and ground. Switches $S_L$, $S_H$ and $S_U$ are further connected to inverters $82_L$, $82_H$ and $82_U$, respectively, which have their outputs connected to first inputs of NAND circuits $83_L$, $83_H$ and $83_U$, respectively. The second inputs of these NAND circuits receive the signal $P_A$ from mode change-over switch 61 to selectively actuate band memory 84 which, in turn applies a band indicating signal $P_L$, $P_H$ or $P_U$ to encoder 52 (FIG. 2) in memory 50. In the programming mode of operation, that is, when signal $P_A$ is a binary "1," the output of NAND circuit $83_L$, $83_H$ or $83_U$ is a binary "0" only when the respective switch $S_L$, $S_H$ or $S_U$ is manually closed, representing that the channel identified by the 14-bit code to be written into a selected address in memory 50 is a low VHF channel, a high VHF channel or a UHF channel, respectively.

Address selecting circuit 70 includes a plurality, for example, 16, normally open address selecting switches $S_1, S_2, \ldots S_{16}$ which are each selectively closed for selecting a corresponding one of the 16 addresses or memory units in memory 50 during a programming operation or channel selecting operation. Address selecting circuit 70 further includes neon tubes or other indicators $N_1, N_2, \ldots N_{16}$ corresponding to switches $S_1, S_2, \ldots S_{16}$, an address counter 71 which produces a 4-bit addressing code corresponding to the particular switch $S_1$–$S_{16}$ that is closed for addressing the corresponding memory unit in memory 50, and a decoder 72 which receives the coded output of address counter 71 to produce a binary "0" output signal on a respective one of 16 output lines $L_1, L_2, \ldots L_{16}$. The switches $S_1$–$S_{16}$ are connected, at one side, in common, through series resistors 73 and 74 to ground, while the opposite sides of switches $S_1$–$S_{16}$ are connected to lines $L_1$–$L_{16}$, respectively. Further, the lines $L_1$–$L_{16}$ are connected through resistors $75_1$–$75_{16}$, respectively, and a common resistor 76a to a voltage source +100V, while the neon tubes or indicators $N_1$–$N_{16}$ are connected between the lines $L_1$–$L_{16}$, respectively, and the same voltage source +100V through a common resistor 76b.

A switching transistor 77 has its base electrode connected to resistors 73 and 74, its emitter electrode connected to ground and its collector electrode connected to a voltage source +$V_{cc}$ and to an inverter 78. The output of inverter 78 is connected to one input of a NAND circuit 79, the other input of which receives timing pulses $A_9$ produced by timing counter 20 and having a period of 0.128 m.sec. The output of NAND circuit 79 is applied to address counter 71 which counts each binary "0" produced by the NAND circuit.

Load pulse $P_B$ that is applied to AND circuits $42_1$–$42_{14}$ of counter 40 for reading out the channel identifying code $C_1$–$C_{14}$ from an addressed memory unit in memory 50 (FIG. 2), is produced by NAND circuit 44 and supplied through NAND circuit 48 to the AND circuits. One input of NAND circuit 44 is supplied with the signal $P_A$ through inverter 43, and the other input of NAND circuit 44 is connected to the output of a monostable multivibrator 45 which is triggered by a binary "1" at the collector of transistor 77. When signal $P_A$ is a binary "0," as during the channel selecting mode of operation, and monostable multivibrator 45 is triggered to produce a binary "1" pulse for a predetermined period of, for example, 50 m.sec., load pulse $P_B$ is produced. The load pulse also is produced by correcting circuit 150 when the apparatus initially is connected to a power source, or tuned on. That is, as will be described, when the power supply for the channel selecting apparatus first is turned on, correcting circuit 150 energizes NAND circuit 48 to supply load pulses $P_B$ to counter 40 so that a particular channel identifying code stored at a predetermined memory unit in memory 50 is read out to counter 40 to enable converter 90 to generate a corresponding control voltage, whereby tuner 100 is tuned to a predetermined channel.

Digital-to-analog converter 90 preferably includes a pulse-width modulator 91 operative to produce a chain of pulses at a predetermined repetition rate with the effective width of the pulses in repetitive timing durations being dependent on the channel identifying code $B_1, B_2, \ldots B_{14}$ obtained from counter 40. The recurring pulses from modulator 91 are supplied through a low-pass filter 92 for providing the analog control voltage for a variable reactance device in electronic tuner 100.

Figure 3:
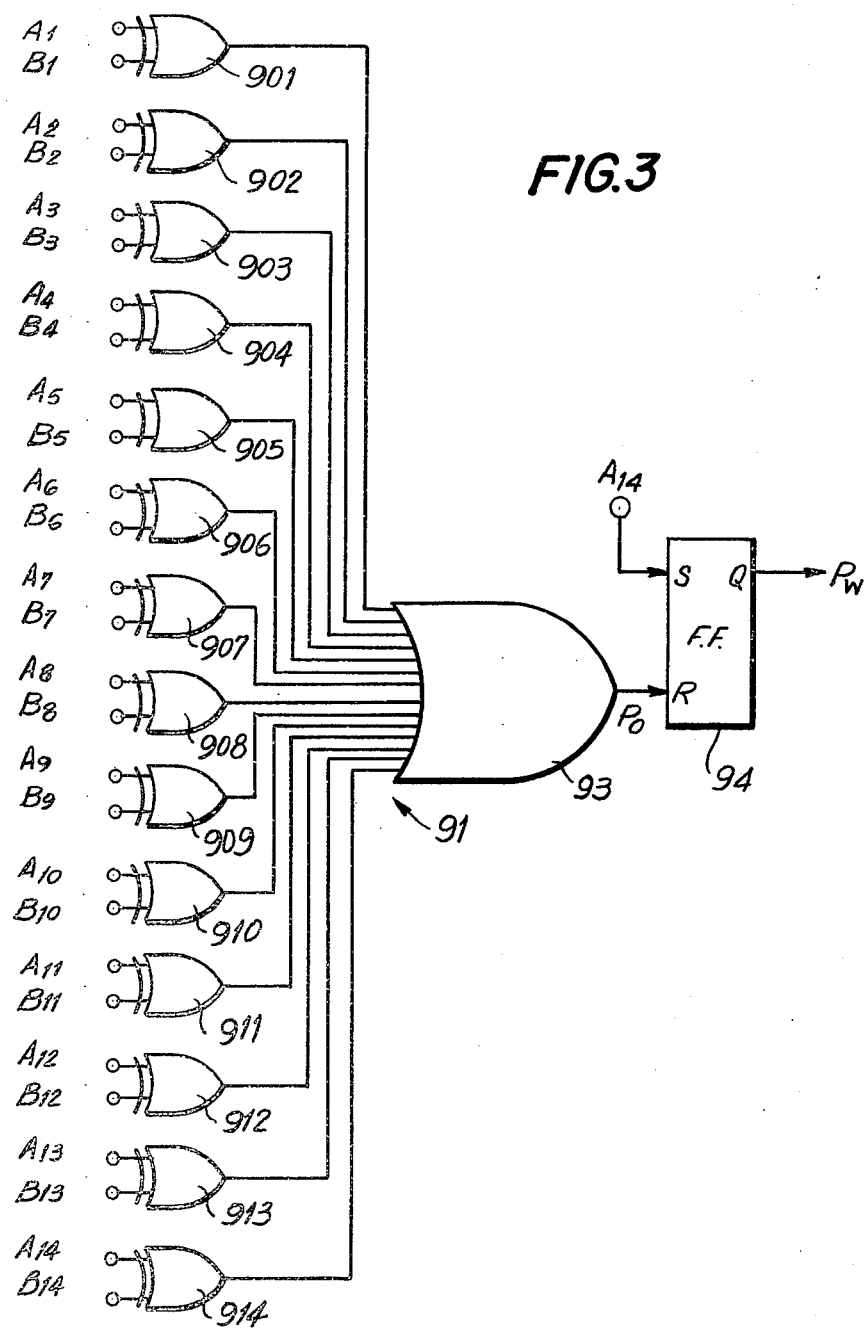
FIG. 3 is a logic diagram illustrating a portion of the control voltage generator used with the electronic tuner of FIG. 1.

One embodiment of pulse width modulator 91 is shown in FIG. 3, including 14 exclusive OR circuits 901, 902, . . . 914 having first and second inputs which respectively receive the timing pulses $A_1, A_2, \ldots A_{14}$ of the recirculating code and the bits $B_1, B_2, \ldots B_{14}$ of the channel identifying code. The outputs of all of the exclusive OR circuits 901-914 are applied through an OR circuit 93 to the reset terminal R of a flip-flop circuit 94 which has the timing pulse $A_{14}$, whose period is 4.096 m.sec., applied to its set terminal S. Flip-flop circuit 94 is a conventional negative-edge triggered flip-flop circuit adapted to provide a binary "1" output at its output terminal Q, that is, to initiate an output pulse $P_W$ in response to timing pulse $A_{14}$, and to terminate output pulse $P_W$, that is, to return to a binary "0," in response to the falling edge of an output pulse $P_O$ from OR circuit 93.

With reference to FIGS. 4B-4E, an output pulse $P_W$ (FIG. 4E) is initiated when the recirculating code $A_1, A_2, \ldots A_{14}$ returns from the state (11111111111111) to the state (00000000000000). So long as the recirculating code is not coincident in level with the channel identifying code ($B_1, B_2, \ldots B_{14}$) then being applied to pulse-width modulator 91, one or more of the exclusive OR circuits 901-914 produces a binary "1" with the result that the output $P_O$ of OR circuit 93 also is a binary "1" (FIG. 4D). Upon the coincidence of all bits of the recirculating code $A_1, A_2, \ldots A_{14}$ with the corresponding bits of the channel identifying code $B_1, B_2, \ldots B_{14}$ during each period T of the recirculating code, the outputs of all of the exclusive OR circuits 901-914 are binary 0's, with the result that the output $P_O$ of OR circuit 93 falls from a binary "1" to a binary "0" so as to reset flip-flop circuit 94 and thereby return the output pulse $P_W$ to a binary "0." Thus, during each recirculating period T of the recirculating code $A_1, A_2, \ldots A_{14}$, output pulse $P_W$ is obtained from flip-flop circuit 94 having a duration extending from the time that the recirculating code $A_1, A_2, \ldots A_{14}$ returns from the state (11111111111111) to the state (00000000000000) until the time of coincidence of the recirculating code with the channel identifying code $B_1, B_2, \ldots B_{14}$. Therefore, when the channel identifying code $B_1, B_2, \ldots B_{14}$ applied to pulse-width modulator 91 changes, a corresponding change occurs in the width of the output pulse $P_W$ during each period T of the circulating code.

For example, as shown on the left-hand portions of FIGS. 4A–4E, if the channel identifying code $B_1, B_2, \ldots B_{14}$ applied to pulse-width modulator 91 is (00000000000001), the output pulse $P_W$ produced during each period of the recirculating code $A_1, A_2, \ldots A_{14}$ commences at the beginning of the period, that is, when the recirculating code returns from the state (11111111111111) to the state (00000000000000), and terminates at the commencement of the first pulse $A_1$, at which time the recirculating code (00000000000001) coincides with the channel identifying code (00000000000001) to cause the output $P_O$ of OR circuit 93 to fall from a binary "1" to a binary "0." Thus, the output pulse $P_W$ produced during each period of the recirculating code has a pulse width of $\tau$.

As shown in the middle portion of FIGS. 4A–4E, if the channel identifying code $B_1, B_2, \ldots B_{14}$ is (00000000000010), the coincidence of that channel identifying code with the recirculating code $A_1, A_2, \ldots A_{14}$ occurs, during each period of the recirculating code, at the commencement of pulse $A_2$, so that the resulting output pulse $P_W$ obtained during each period has a width of $2\tau$. Similarly, as shown in the right-hand portions of FIGS. 4A–4E, if the channel identifying code $B_1, B_2, \ldots B_{14}$ is (00000000000011), the coincidence of such channel identifying code with the recirculating code $A_1, A_2, \ldots A_{14}$ during each period of the latter occurs at the time that both pulse $A_1$ and pulse $A_2$ coexist, so that the resulting output pulse $P_W$ obtained during each period has a pulse-width of $3\tau$.

Thus, the output pulses $P_W$ produced by modulator 91 during successive periods T of the recirculating code $A_1, A_2, \ldots A_{14}$ have their pulse-widths determined by the channel identifying code $B_1, B_2, \ldots B_{14}$, and low pass filter 92 smoothes such output pulses to deliver an analog, or DC control voltage, having a value that corresponds to the width of pulses $P_W$. This control voltage is applied to tuner 100 for determining the broadcast channel frequency to which the apparatus is tuned.

Programming Mode of Operation

When it is desired to program the channel selecting apparatus, that is, to store at the various addresses in memory 50 channel identifying codes corresponding to various channels that are receivable in the region where the television receiver is located so that, thereafter, such channels can be received or selected merely by actuation of the switches $S_1$–$S_{16}$ corresponding to the respective addresses, mode change-over switch 61 is engaged with contact $a$ for selecting the programming mode of operation and for providing a binary "1" signal $P_A$. If it is desired, for example, to store at the address or memory unit $51_1$ a channel identifying code corresponding to the receiving frequency for channel "2", address selecting switch $S_1$ is manually closed. The binary "1" at line $L_1$ of decoder 72 is applied through switch $S_1$ to turn ON transistor 77 in address selecting circuit 70. Thus, inverter 78 supplies a binary "1" to NAND circuit 79 which is conditioned to apply a binary "0" to address counter 71 in response to each timing pulse $A_9$ from timing counter 20. Address counter 71 counts each binary "0" applied thereto until the resulting 4-bit code from address counter 71 corresponds to the address or memory unit $51_1$ selected by the closing of switch $S_1$. At that time, decoder 72 decodes this particular 4-bit code from address counter 71 to provide a binary "0" on the corresponding output line $L_1$. This binary "0" on line $L_1$ turns OFF transistor 77 so that inverter 78 disables NAND circuit 79 with a binary "0" and address counter 71 ceases counting. Accordingly, the 4-bit address code corresponding to switch $S_1$ is applied to memory 50 for selecting or activating the address or memory unit $51_1$ corresponding to switch $S_1$.

Since channel "2" is a low VHF channel, switch $S_L$ of band indicating signal forming circuit 80 is closed to provide a binary "1" to NAND circuit $83_L$ through inverter $82_L$. It is recalled that $P_A$ is a binary "1" and, therefore, NAND circuit $83_L$ applies a binary "0" to band memory 84, whereby the band selecting pulse $P_L$ is supplied through encoder 52 and decoder 53 of memory 50 (FIG. 2) to provide the signal $V_L$ for selecting the low band or channel of the VHF tuning section in tuner 100.

Having selected the memory address at which a channel identifiying code is to be programmed and the band or section of tuner 100 which is associated with the channel to be programmed, sweep pulse generating circuit 30 is made operative, for example, by closing coarse up-sweep switch 31CU. When switch 31CU is closed, inverter $33_3$ applies a binary "1" to NAND circuit $34_3$. Therefore, at each "0" level of timing pulse $A_{14}$ (which pulse has a period of 4.096 m.sec.), NAND circuit $34_3$ applies a binary "1" to one input of NAND circuit 304. Since the fine up-sweep switch 31FU is open, inverter $33_1$ applies a binary "0" to NAND circuit $34_1$ which, in turn, supplies a constant binary "1" to NAND circuit 301. However, because switch 31CU is closed, NAND circuit 36 produces a binary "1" which is inverted and supplied as a binary "0" to NAND circuit $38_1$, thus to apply a binary "1" to the other input of NAND circuit 301. Hence, inverter 303 applies a binary "1" to the other input of NAND circuit 301. Hence, inverter 303 applies a binary "1" to the other input of NAND circuit 304. Therefore, when coarse up-sweep switch 31CU is closed, NAND circuit 304 applies a binary "0" to NAND circuit 308 in response to each timing pulse $A_{14}$, the latter NAND circuit being conditioned by the binary "1" level normally assumed by signal $P_G$; whereupon an up-sweep pulse $P_U$ is applied to counter 40. These pulses $P_U$ now exhibit a short period of 4.096 m.sec. and, therefore, may be considered coarse up-sweep pulses which cause relatively rapid changes in the count of counter 40. The count of counter 40 thus is changed, in sequence, in the upward direction to similarly change the resulting channel identifying code $B_1, B_2, \ldots B_{14}$ obtained therefrom once during every period T of the timing code $A_1, A_2, \ldots A_{14}$, starting from the state (00000000000000) and incrementing toward a maximum state (11111111111111). The changing channel identifying code from counter 40 and the recirculating timing code from timing counter 20 are applied to pulse-width modulator 91 to obtain an analog level corresponding to the channel identifying code, in the programming mode of operation. Thus, so long as switch 31CU of sweep pulse generating circuit 30 is held in its closed condition, the channel selecting or control voltage from low pass filter 92 is increased progressively, for example, by about 2 m.V at every period T=4.096 m.sec. of the recirculating timing code, and hence the receiving frequency established by tuner 100 increases progressively.

When a video picture being broadcast by channel "2" appears on the screen of the television receiver, the coarse up-sweep switch 31CU is released by the operator so as to return to its normal open condition. Upon opening of switch 31CU, the supplying of the coarse up-sweep pulses $P_U$ to counter 40 is terminated and the count then exhibited by counter 40 remains unchanged. This count represents the channel identifying code $B_1$, $B_2$, ... $B_{14}$ to determine the approximate value of the receiving frequency of tuner 100 for the desired channel. Thereafter, the fine up-sweep switch 31FU may be closed to provide fine up-sweep pulses $P_U$ from inverter 37, which fine up-sweep pulses have a period 64 times that of the coarse up-sweep pulses by reason of divider 35. That is, when switch 31FU is closed, NAND circuit $34_1$ is conditioned to supply the fine pulses $(A_{14} \div 64)$ through conditioned NAND circuit 301, inverter 303, NAND circuit 304 and conditioned NAND circuit 308. In counting the fine up-sweep pulses, counter 40 sequentially changes its count, and thus the resulting channel identifying code $B_1$, $B_2$, ... $B_{14}$, at every period $64T = 262.144$ m.sec. Thus, the channel selecting or control voltage from low pass filter 92 is increased by about 2 mV at every period 64T for similarly changing the receiving frequency determined by tuner 100.

When viewing of the picture on the screen of the television receiver indicates that fine tuning has been achieved in respect to the video signal broadcast by the desired channel, switch 31FU is released to return to its open condition and thereby halt the supplying of the fine up-sweep pulses to counter 40. Accordingly, counter 40 stops counting with the instantaneous count thereof representing the resulting channel identifying code $B_1$, $B_2$, ... $B_{14}$ corresponding to a value of the analog control voltage applied to tuner 100 to establish a receiving frequency for the fine-tuned reception of channel "2." Thereafter, write-in switch 62 is closed to supply a binary "1" to NAND circuit 63 which had been enabled, or conditioned, by the binary "1" of signal $P_A$. The binary "0" thus produced by NAND circuit 63 energizes instruction signal forming circuit 65 to supply an erasing pulse $P_E$ to memory 50 so as to erase any contents previously stored in the addressed memory unit $51_1$ (selected by the closing of switch $S_1$) and then to supply a write-in pulse $P_{WR}$ to memory unit $51_1$ to enable the channel identifying code $B_1$, $B_2$, ... $B_{14}$ of counter 40 and the band identifying signal $P_L$ from band memory 84 to be written into the respective cells of memory unit $51_1$.

When all of switches 31FU, 31FD, 31CU and 31CD are opened, NAND circuit 36 produces a binary "0" which is inverted by inverter 37 and applied as a binary "1" to condition NAND circuit $38_1$ and $38_2$ to respond to fine pulses $(A_{14} \div 64)$ produced by divider 35 in the event that the discriminated outputs $E_U$ or $E_D$, respectively, are produced by AFT circuit 120 during an AFT operation, as will be described. That is, if AFT circuit 120 detects that the control voltage then being applied to tuner 100 establishes a frequency that deviates from the broadcast channel "2" frequency, the AFT operation will apply either up-sweep pulses $P_U$ or down-sweep pulses $P_D$ to counter 40 so as to adjust the channel identifying code $B_1$, $B_2$, ... $B_{14}$ until the apparatus is fine-tuned to broadcast channel "2." It is this adjusted channel identifying code which preferably is written into the respective cells of memory unit $51_1$.

Following the programming of memory unit $51_1$ with a channel identifying code and a band indicating code corresponding to channel "2," the other memory units $51_2$–$51_{16}$ of memory 50 may be similarly programmed with coded information corresponding to other VHF and/or UHF channels that are receivable in the region where the television receiver is located. Thus, for example, if it is desired to program memory unit $51_2$ with coded information corresponding to channel "4," change-over switch 61 is kept in engagement with its fixed contact $a$ for establishing the programming mode of operation, and address selecting switch $S_2$ is closed for addressing memory unit $51_2$. Since channel "4" is also a low VHF channel, switch $S_L$ of band indicating signal forming circuit 80 again is closed and, for example, coarse up-sweep switch 31CU of the sweep-pulse generating circuit is held in its closed position until counter 40, in counting the resulting up-sweep pulses, has changed the channel identifying code $B_1$, $B_2$, ... $B_{14}$ from the code that represented fine tuning of channel "2" to the code representing approximate tuning of channel "4." After the channel identifying code has been further modified by fine tuning (and AFT), as described above, write-in switch 62 is again closed for effecting the writing into memory $51_2$ of the channel identifying and band indicating codes for the desired channel "4." Thus, at each of the addresses of memory 50 there can be sequentially written or stored the channel identifying and band indicating codes corresponding to a respective desired channel.

Although the programming of the channel selecting appparatus according to this invention has been described above as being effected by the sequential closing of the coarse up-sweep switch 31CU and the fine up-sweep switch 31FU, in which case, the coarse or fine up-sweep pulses $P_U$ are counted in the upward direction by counter 40 for progressively increasing the receiving frequency of tuner 100, it will be apparent that the programming operation can be similarly effected by the successive closing of the coarse down-sweep switch 31CD and the fine down-sweep switch 31FD so that counter 40 is made to count in the downward direction for progressively decreasing the receiving frequency of tuner 100. Whether counter 40 is made to count in the upward direction or in the downward direction, as aforesaid, is merely dependent upon the relationship of the receiving frequency for a channel which is to be programmed relative to the receiving frequency for the channel which has been previously programmed and, in each case, the direction in which counter 40 is made to count is selected so as to minimize the time required for the programming operation.

Channel Selecting Mode of Operation

After the programming of memory 50 has been completed, as described above, mode change-over switch 61 can be closed to its fixed contact $b$ and thereby provide the signal $P_A$ as a binary "0" for establishing the channel selecting mode of operation. This binary "0" signal $P_A$ disables NAND circuit $83_L$, $83_H$ and $83_U$, and also NAND circuit 63, thus de-energizing band indicating signal forming circuit 84 and instruction signal forming circuit 65 so that the latter supplies the reading pulse $P_R$ to memory 50.

Preferably, when the channel selecting apparatus is initially turned ON, address counter 71 of address selecting circuit 70 is reset thereby to produce a 4-bit code addressing memory unit $51_1$ in memory 50. As will be described below with reference to FIGS. 7 and 8, correcting circuit 150 is responsive to the initial energization of the power supply for applying a binary "0" pulse to NAND circuit 48, thereby producing a load pulse $P_B$. Load pulse $P_B$, when applied to AND circuits $42_1$–$42$ in counter 40 (FIG. 2), transmits the channel identifying code $C_1, C_2, \ldots C_{14}$ previously stored in memory unit $51_1$ to counter 40. At the same time, the band indicating code stored in the respective cells of memory unit $51_1$ is read out to decoder 53 so that, for example, the signal $V_L$ is applied to tuner 100 for selecting the low band of the VHF tuning section. During the duration of load pulse $P_B$, the bits $C_1$–$C_{14}$ of the read out channel identifying code are applied to the respective flip-flop circuits $41_1$–$41_{14}$ of counter 40 with the result that such flip-flop circuits are set for providing the channel identifying code $B_1$–$B_{14}$ from counter 40 to pulse-width modulator 91, whereby a control voltage for tuner 100 suitable for fine tuning of the receiving frequency to that of channel "2" (assumed to be stored in memory unit $51_1$) is produced.

Thereafter, if it is desired to receive a channel programmed in any other memory unit of memory 50, for example, if it is desired to receive channel "4" programmed in memory unit $51_2$, as described above, switch $S_2$ of address selecting circuit 70 is closed and, as previously described in connection with the programming mode of operation, address counter 71 counts the pulses $A_9$ until the 4-bit code from address counter 71 reaches the count corresponding to the address of the second memory unit $51_2$. When this count is reached, decoder 72 applies a binary "0" to output line $L_2$ so that transistor 77 is turned OFF and its collector output rises from a binary "0" level to a binary "1" level. Such rise in the collector output of transistor 77 triggers monostable multivibrator 45, the output from which is applied as a binary "1" to NAND circuit 44. Since the signal $P_A$ is a binary "0," inverter 43 conditions NAND circuit 44 to respond to the monostable multivibrator output and apply a binary "0" to NAND circuit 48, resulting in a load pulse $P_B$ applied to counter 40. In response to the load pulse $P_B$, the channel identifying code being read out of memory unit $51_2$ correspondingly changes the states of the flip-flop circuits of counter 40 so that the latter supplies the corresponding channel identifying code $B_1, B_2, \ldots B_{14}$ to pulse width modulator 91. Therefore, the control voltage applied to tuner 100 is sufficient to cause the tuner to establish the receiving frequency for channel "4."

It will be apparent that the channels programmed in the other memory units $51_3$–$51_{16}$ may be similarly selectively received merely by closing a respective one of the address selecting switches $S_1$–$S_{16}$.

AFT Operation

In the illustrated channel selecting apparatus, the AFT operation is performed substantially continuously during the channel selecting mode. Two aspects of this AFT operation now will be described: (a) when a switch $S_1, \ldots S_{16}$ is actuated to change the channel to which tuner 100 is tuned; and (b) when the power supply first is energized.

(a) Channel Changing

As discussed above, when a particular switch $S_1, \ldots S_{16}$ is actuated, address counter 71 selects a different memory unit 51 in memory 50 from which the stored channel identifying code is read out; and this changes the control voltage applied to tuner 100. It may be expected that the control voltage changes gradually and, while changing, its instantaneous level may correspond to an unwanted frequency, such as the frequency assigned to a non-selected channel or the audio carrier frequency of an adjacent, lower channel. AFT circuit 120 will attempt to pull in this unwanted frequency; and if the control voltage change is sufficiently slow, the AFT operation may successfully tune the apparatus to such an unwanted frequency.

In order to inhibit or prevent the AFT operation when a stored channel identifying code is read out of memory 50, an inhibit pulse $P_G$ is produced by inhibit circuit 140 and applied to NAND circuits 308 and 309 for inhibiting these NAND circuits from responding to upward or downward correction pulses that would be generated by NAND circuits $38_1$ and $38_2$ in response to discriminated outputs $E_U$ and $E_D$, respectively, during an AFT operation. The AFT inhibiting circuit 140 is shown to include an inverter 141 receiving the collector output of transistor 77, a monostable multivibrator 142 which is triggered by the negative transition, or edge, of the output from inverter 141 to produce a positive pulse having a pulse width of, for example, 10 m.sec. This pulse is inverted by an inverter 143 to produce a negative inhibit pulse $P_G$ which, as previously mentioned, is applied to NAND circuits 308 and 309 of sweep pulse generating circuit 30. Thus, during the existence or occurrence of the negative inhibit pulse $P_G$, the application of upward or downward correction pulses through NAND circuit 308 or 309, respectively, to counter 40 is prohibited.

(b) Power Supply Energization

Figure 5:
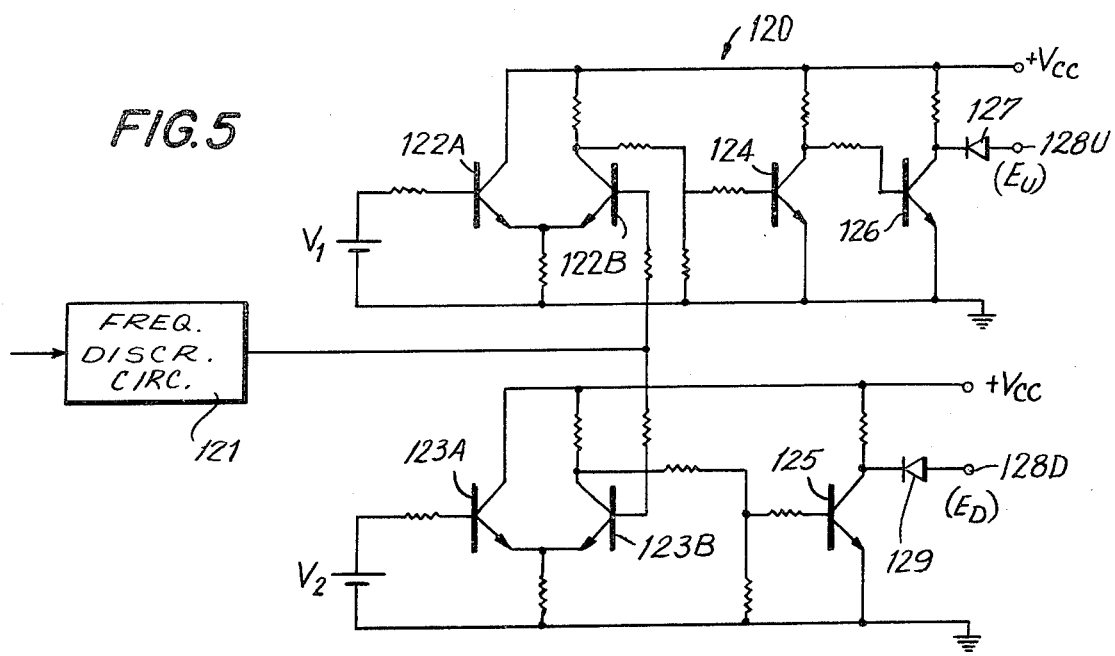
FIG. 5 is a schematic diagram illustrating a portion of the AFT circuit that is used with the electronic tuner of FIG. 1.
Figure 6A:
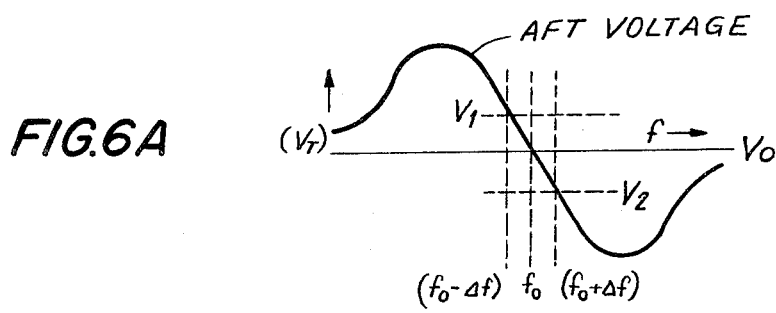
FIGS. 6A-6C are waveform diagrams that are helpful in explaining the AFT operation performed by the circuit shown in FIG. 5.

It is a desirable feature of the present invention that the AFT operation is not inhibited or interrupted when the power supply for the illustrated apparatus first is energized. Consequently, there is the possibility that, when the power source is turned ON and address counter 71 addresses a predetermined memory unit ($51_1$) to supply a corresponding channel identifying code to converter 90, the AFT operation may pull in an unwanted frequency corresponding to an instantaneous level of the control voltage applied to tuner 100 prior to the time that the control voltages reach the level determined by the read-out channel identifying code. This may best be appreciated by first considering the AFT circuit and its operation. As seen in FIG. 5 AFT circuit 120 comprises a conventional frequency discriminator circuit 121 connected to the output of video IF amplifier 110 to provide an AFT voltage $V_T$. As shwon in FIG. 6A, the AFT voltage $V_T$ has a predetermined value $V_o$ when the video intermediate frequency $f$ has the correct value $f_o$, and the AFT voltage $V_T$ varies from the value $V_o$ in accordance with a generally S-shaped curve for values of the video intermediate frequency above and below the value $f_o$. The output of frequency discriminator circuit 121 is coupled to a first differential amplifier comprised of transistors 122A and 122B and to a second differential amplifier comprised of transistors 123A and 123B. Reference voltages $V_1$ and $V_2$ ($V_1 > V_o > V_2$) are respectively applied to the base electrodes of transistors 122A and 123A, while the AFT voltage $V_T$ from circuit 121 is applied to the base electrodes of transistors 122B and 123B. The collector outputs of transistors 122B and 123B are applied to the base electrodes of transistors 124 and 125, respectively, and the collector output of transistor 124 is applied, in turn, to the base electrode of a transistor 126. Finally, the collector output of transistor 126 is coupled through a diode 127 to an output terminal 128U to provide the discriminated output $E_U$, and the collector output of transistor 125 is coupled through a diode 129 to an output 128D to provide the discriminated output $E_D$.

Figure 6B:
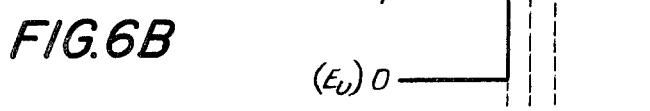
Figure 6C:
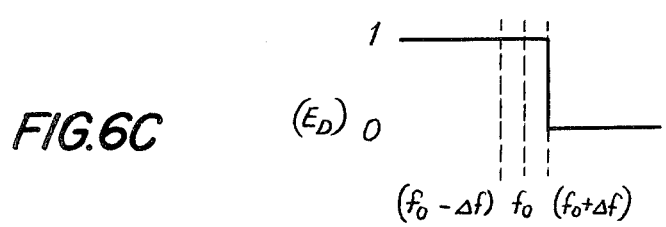

When the AFT voltage $V_T$ exceeds the reference voltage $V_1$, that is, when the video intermediate frequency from amplifier 110 is less than $(f_o - \Delta f)$, transistors 122A and 122B are respectively non-conductive and conductive. Therefore, transistor 124 is turned OFF so as to turn ON transistor 126 and a low voltage corresponding to a binary "0" is provided at the collector electrode of the latter and coupled through diode 127 to output terminal 128U as the discriminated output $E_U$, as shown in FIG. 6B. At the same time, transistor 123B is turned ON thereby to make transistor 125 non-conductive, so that the collector voltage of the latter transistor is at a high level corresponding to a binary "1" which is coupled through diode 129 to output terminal 128D as the discriminated output $E_D$, as shown in FIG. 6C.

If the video intermediate frequency from amplifier 110 is in the range between the frequencies $(f_o - \Delta f)$ and $(f_o + \Delta f)$, that is, within the normal tuning range, the AFT voltage from circuit 121 is between $V_1$ and $V_2$ and, therefore, transistor 123B remains ON and the discriminated output $E_D$ continues to be a binary "1." However, with $V_T$ being less than $V_1$, transistor 122B is turned OFF and, as a result, transistor 126 is made non-conductive so that the discriminated output $E_U$ becomes a binary "1."

Finally, when the AFT voltage $V_T$ from frequency discriminating circuit 121 is less than $V_2$, that is, when the video intermediate frequency from amplifier 110 is greater than $(f_o + \Delta f)$, the discriminated output $E_U$ remains as a binary "1," but transistor 123B is turned OFF so as to make transistor 125 conductive and, as a result thereof, the discriminated output $E_D$ becomes a binary "0."

The reference voltages $V_1$ and $V_2$ of AFT circuit 120 are suitably selected so that $\Delta f$ will be about 50 kHz. In the normal tuned condition, that is, when the frequency $f$ is in the range between $f_o - 50$ kHz and $f_o + 50$ kHz, the discriminated outputs $E_U$ and $E_D$ are both a binary "1" and no correction is made in the channel identifying code $B_1, B_2, \ldots B_{14}$ applied to pulse width modulator 91. Hence, the control voltage applied to tuner 100, which determines the local oscillation frequency established in the tuner 100, and thus the channel frequency to which the apparatus is tuned, is not varied. On the other hand, when $f$ is less than $f_o - 50$ kHz, the resulting binary "0" of discriminated output $E_U$ is effective to condition NAND circuit $38_1$ in sweep pulse generating circuit 30 (FIG. 1) to supply upward correction pulses which are counted by counter 40 for modifying the channel identifying code $B_1, B_2, \ldots B_{14}$ so as to raise the local oscillation frequency and thereby bring the receiver to the normal or correct tuned condition. Conversely, if the frequency $f$ is greater than $f_o + 50$ kHz, the resulting binary "0" of the discriminated output $E_D$ is effective to condition NAND circuit $38_2$ in sweep pulse generating circuit 30 to supply downward correction pulses to counter 40 so that the channel identifying code $B_1, B_2, \ldots B_{14}$ applied from counter 40 to pulse width modulator 91 is modified for decreasing the local oscillation frequency and thereby provide the normal or correct tuned condition of the receiver.

In view of the foregoing, it is appreciated that the AFT operation may successfully pull in an unwanted frequency, such as a frequency corresponding to a lower channel or a frequency corresponding to the audio carrier associated with a lower channel, during the time required for the control voltage applied to tuner 100 to rise gradually to its predetermined level following the read-out of the channel identifying code stored in a predetermined memory unit in response to the initial energization of the power supply. This erroneous pull-in is avoided in accordance with the present invention wherein a correcting circuit 150 is provided, this correcting circuit being responsive to the initial energization of the power supply so as to generate a load pulse $P_B$ for reading out the predetermined memory unit from memory 50 into counter 40, and then generating another load pulse $P_B$ at a later time to read out once again that very same memory unit. Correcting circuit 150 is shown in the schematic representation of FIG. 7. As there depicted, the correcting circuit includes a time constant circuit 152 that is responsive to the gradual increase in power supply voltage $+V_{cc}$, first and second differentiating circuits 154A and 154B connected in common to the output of time constant circuit 152, a monostable multivibrator, or one-shot circuit 156 coupled to said differentiator circuit 154B, a further differentiator circuit 154C coupled to the output of one-shot circuit 156, and an output transistor 159.

Time constant circuit 152 includes an RC circuit formed of series-connected capacitor 152a and resistor 152b connected across the output of the power supply so as to receive the operating voltage $+V_{cc}$. The junction defined by the capacitor and resistor is connected through a current limiting resistor to the base electrode of a transistor 153. The collector electrode of this transistor is coupled through a load resistor 153a to the power supply terminal and, additionally, to common-connected differentiator circuits 154A and 154B. Each of these differentiator circuits is conventional and is comprised of a capacitor having an output coupled to a reference potential, such as ground, by a resistor. A diode 155A couples the output of differentiator circuit 154A to the base electrode of output transistor 159.

The output of differentiator circuit 154B is coupled via a diode 155B to an input terminal of one-shot circuit 156. This one-shot circuit is conventional and includes a pair of cross-coupled transistors $Q_1$ and $Q_2$, the base electrode of transistor $Q_1$ being coupled to diode 155B. One-shot circuit 156 normally exhibits its quiescent state wherein transistor $Q_2$ is conductive and transistor $Q_1$ is non-conductive. Hence, a relatively low voltage level normally is provided at the collector electrode of transistor $Q_2$. However, if a triggering voltage is applied to the base electrode of transistor $Q_1$, the one-shot circuit abruptly switches to its unstable state wherein transistor $Q_1$ is conductive and transistor $Q_2$ is non-conductive for a predetermined period of time depending upon the time constant of the one-shot circuit.

The output terminal of one-shot circuit 156 is provided at the collector electrode of transistor $Q_2$ and is coupled via a reverse-poled diode 157 to the base electrode of a transistor 158. Differentiator circuit 154C is coupled to the collector electrode of transistor 158, and a diode 155C couples the output of differentiator circuit 154C to the base electrode of transistor 159. As shown, differentiator circuit 154C is of similar construction as the previously described differentiator circuits 154A and 154B.

The operation of the correcting circuit illustrated in FIG. 7 now will be described in conjunction with the waveform diagrams of FIGS. 8A-8G, and also in conjunction with the channel selecting apparatus depicted in FIG. 1. When the power source for the apparatus first is turned ON thereby to energize initially the power supply, operating voltage $+V_{cc}$ derived from the power supply gradually increases, as shown in FIG. 8A. Since the voltage across a capacitor cannot change abruptly, the voltage appearing at the junction defined by capacitor 152a and resistor 152b also increases as the operating voltage $+V_{cc}$ increases. Hence, transistor 153 is turned ON, thereby lowering its collector voltage approximately to ground level.

When the rate at which the operating voltage $+V_{cc}$ increases is less than the time constant of time constant circuit 152, the side of capacitor 152a that is connected to resistor 152b begins to discharge therethrough. Consequently, the base voltage applied to transistor 153 now decreases. Once this base voltage has decreased below the threshold level necessary to maintain conduction, transistor 153 is turned OFF abruptly, and its collector voltage $S_A$ rises, as shown in FIG. 8B. This positive transition in the collector voltage is differentiated by differentiator circuit 154A and also by differentiator circuit 154B so as to produce the pulse $S_B$ (FIG. 8C) at the output of each differentiator circuit. This positive voltage pulse $S_B$ is applied by diode 155A to turn ON transistor 159. Thus, the collector voltage $S_E$ of transistor 159 changes from a binary "1" to a binary "0" as shown in FIG. 8F, to produce a negative pulse $S_{E1}$. This negative $S_{E1}$ is applied to NAND circuit 48 (FIG. 1) thereby applying a load pulse $P_B$ to counter 40. It is recalled that when the power source for the apparatus first is turned ON, a predetermined memory unit in memory 50 is addressed. The channel identifying code stored in that memory unit thus can be transferred to counter 40 in response to the load pulse $P_B$ produced by pulse $S_{E1}$.

Now, since the power source is energized initially, the control voltage $E_X$ produced by converter 90 in response to the read-out channel identifying code gradually increases toward its predetermined control voltage level. As this control voltage $E_X$ increases, tuner 100 is correspondingly varied. Let it be assumed that the control voltage level corresponding to the read-out channel identifying code is equal to $l_p$, as shown in FIG. 8G. As the control voltage $E_X$ rises toward this level, it assumes the instantaneous level $l_s$. If this level corresponds to a predetermined broadcast frequency, such as the frequency of a lower channel or the audio carrier frequency of an adjacent channel, the AFT operation described above will attempt to pull in this predetermined frequency. Consequently, control voltage $E_X$ may be maintained at this lower level $l_s$ rather than continuing in its increase toward its predetermined level $l_p$. Thus, tuner 100 may erroneously be pulled in to the unwanted predetermined frequency associated with the level $l_s$.

This possibility is avoided by the correcting circuit wherein the positive pulse $S_B$ produced by differentiator circuit 154B concurrently with the positive pulse produced by differentiator circuit 154A is applied as a triggering signal to one-shot circuit 157. Consequently, this one-shot circuit is triggered to its unstable state to provide the collector electrode of transistor $Q_2$ with a higher voltage level shown as voltage $S_C$ in FIG. 8D. At the conclusion of the predetermined time delay exhibited by this one-shot circuit, for example, after 300 m.sec., one-shot circuit 156 returns to its quiescent condition whereupon the collector voltage $S_C$ of transistor $Q_2$ returns to its lower level.

For the duration that one-shot circuit 156 exhibits its unstable, or active, state, the voltage $S_C$ is applied to transistor 158 to maintain that transistor conductive. However, once the one-shot circuit returns from its active state to its quiescent state, transistor 158 is turned OFF so that its collector voltage increases abruptly. This positive transition in the collector voltage of transistor 158 is differentiated by differentiator circuit 154C to produce the positive pulse $S_D$. Diode 155C applies this positive pulse to transistor 159 which, in turn, is rendered conductive to produce the output pulse $S_{E2}$ shown in FIG. 8F. Hence, it is appreciated that this negative pulse $S_{E2}$ is applied through NAND circuit 48 as a second load pulse $P_B$ to counter 40, whereby the channel identifying code stored in the same addressed memory unit once again is read out. Thus, even though the AFT operation may have varied the control voltage $E_X$ so as to be maintained at the level $l_s$, once the channel identifying code is reread from memory 50, converter 90 is enabled to convert this read out channel identifying code to the control voltage $E_X$ of proper level $l_p$. Accordingly, tuner 100 now is tuned to the frequency associated with the read out channel identifying code, and the AFT operation now pulls in this desired frequency and maintains the control voltage $E_X$ at its predetermined level $l_p$. It may be appreciated that the control voltage $E_X$ undergoes a level change from the previous level $l_s$ to its predetermined level $l_p$ at a rate that is too fast for the AFT operation to pull in another unwanted frequency that may be associated with a control voltage level that lies between $l_s$ and $l_p$. Therefore, the possibility of erroneously pulling in an unwanted frequency due to the AFT operation when the power supply first is energized is avoided in accordance with the correcting circuit shown in FIG. 7.

While the present invention has been particularly shown and described with reference to a preferred embodiment thereof and in conjunction with a particular channel selecting apparatus, various changes and modifications in form and details may be made by one of ordinary skill in the art without departing from the spirit and scope of this invention. It is, therefore, intended that the appended claims be interpreted as including all such changes and modifications.

What is claimed is:

1. A method of tuning an electronic tuner of the type having a voltage-controlled tuning element to a selected one of plural broadcast frequencies, wherein a selected one of plural control voltages, which gradually build up to respective control voltage levels, is applied to said tuning element to tune said tuner to a corresponding broadcast frequency, comprising the steps of subjecting said tuner to an automatic fine tuning operation during the interval that said selected control voltage builds up to its control voltage level whereby said selected control voltage is varied from its control voltage level by said automatic fine tuning operation as a function of the frequency pulled in thereby; and reapplying said selected control voltage to said tuning element at a time delayed from the initial application thereof.

2. The method of claim 1 wherein said electronic tuner is provided with storage means for storing individual representations of said plural broadcast frequencies, respectively, and wherein said selected control voltage is applied to said tuning element by the steps of reading out a corresponding representation from said storage means; and converting said representation to an associated voltage level.

3. The method of claim 2 wherein said step of subjecting said tuner to an automatic fine tuning operation whereby said selected control voltage is varied from its control voltage level comprises the steps of detecting the deviation between the frequency to which said tuner is instantaneously tuned by said applied voltage and a predetermined frequency; and modifying said read out representation in accordance with said deviation and in a manner to reduce said deviation, whereby said modified representation is converted to a corresponding voltage and applied to said tuning element.

4. A method of tuning to a selected one of plural broadcast frequencies an electronic tuner of the type having a voltage-controlled tuning element and storage means for storing individual representations of said plural broadcast frequencies, respectively, and wherein a selected one of plural control voltage levels is applied to said tuning element to tune said tuner to a corresponding broadcast frequency; said method comprising the steps of reading out from said storage means; the one of said representations corresponding to said selected broadcast frequency; converting said one representation to an associated voltage level; detecting the deviation between the frequency to which said tuner is instantaneously tuned by said applied voltage and a predetermined frequency; modifying said read out representation in accordance with said deviation and in a manner to reduce said deviation, whereby said modified representation is converted to a corresponding voltage and applied to said tuning element; re-reading out the same representation previously read from said storage means; converting said re-read representation to said associated voltage level; and applying said last-mentioned voltage level to said tuning element.

5. A method of tuning an AFT-controlled electronic tuner to a selected frequency when a power supply for said tuner first is energized, comprising the steps of reading out a predetermined representation of said frequency from a storage means when said power supply is energized; generating a control voltage corresponding to said read out representation, said control voltage gradually increasing in magnitude from an initial level to its control voltage level; applying said control voltage to a tuning element for correspondingly tuning said electronic tuner as said control voltage gradually increases; and reading out said predetermined representation from said storage means once again in response to the energization of said power supply and at a predetermined delayed time following the first read out, thereby to enable said control voltage applied to said tuning element to increase to its control voltage level in the event that said AFT-controlled tuner pulled in an unwanted frequency corresponding to an instantaneous level reached by said control voltage during its gradual increase.

6. The method of claim 5 wherein said step of generating a control voltage comprises the steps of converting the initially read out representation to a control voltage of corresponding level; detecting the tuning condition of said tuner to sense whether said tuner is tuned to any one of plural predetermined frequencies; and varying said read out representation so as to adjust said control voltage as a function of said detected tuning condition until said tuner is tuned to one of said predetermined frequencies.

7. The method of claim 6 wherein said storage means is addressable, and said step of reading out a predetermined representation from said storage means comprises the steps of selecting a predetermined address when said power supply is energized; generating a first pulse at a predetermined time following the energization of said power supply; and applying said first pulse to said storage means to read out said representation stored at said predetermined address.

8. The method of claim 7 wherein said step of reading out said predetermined representation once again comprises the steps of establishing a time delay interval when said first pulse is generated; generating a second pulse at the conclusion of said time delay interval; and applying said second pulse to said storage means to read out said representation stored at said predetermined address.

9. In channel selecting apparatus for a television receiver of the type wherein a control voltage is applied to a tuning element included in an electronic tuner to determine the particular frequency to which said tuner is tuned and wherein said electronic tuner is provided with automatic fine tuning means, apparatus for preventing said automatic fine tuning means from pulling in an unwanted frequency when a power supply for said tuner first is energized, comprising control voltage supply means for supplying a plurality of preselected control voltages representing corresponding frequencies to which said tuner is capable of being tuned; means for applying a selected control voltage to said tuning element when said power supply first is energized, said applied control voltage gradually increasing from an initial level to a predetermined level; and means responsive to the energization of said power supply for re-applying said selected control voltage to said tuning element at a predetermined time subsequent to said energization of said power supply.

10. The apparatus of claim 9 wherein said automatic fine tuning means comprises means for detecting the deviation between the frequency to which said tuner is tuned by the instantaneous level of said applied selected control voltage as said voltage gradually increases and a predetermined frequency; and adjusting means responsive to said detected deviation for adjusting the level of said applied selected control voltage so as to tune said tuner to said predetermined frequency.

11. The apparatus of claim 9 wherein said control voltage supply means comprises storage means for storing plural selectable voltage representations; and control voltage generating means for generating a corresponding control voltage in response to the selection of one of said voltage representations.

12. In channel selecting apparatus for a television receiver of the type wherein a control voltage is applied to a tuning element included in an electronic tuner to determine the particular frequency to which said tuner is tuned and wherein said electronic tuner is provided with a power supply and automatic fine tuning means: apparatus for preventing said automatic fine tuning means from pulling in an unwanted frequency when said power supply for the tuner first is energized, comprising control voltage supply means for supplying a plurality of preselected control voltages representing corresponding frequencies to which said tuner is capable of being tuned, said control voltage supply means including storage means for storing plural selectable voltage representations and control voltage generating means for generating a corresponding control voltage in response to the selection of one of said voltage representations; means for applying a selected control voltage to said tuning element when said power supply first is energized, said applied control voltage gradually increasing from an initial level to a predetermined level, said means for applying a selected control voltage including selecting means for selecting a predetermined one of said voltage representations when said power supply is energized, pulse generating means responsive to the energization of said power supply for generating a pulse, and means responsive to said pulse for applying said selected voltage representation to said control voltage generating means; and means responsive to the energization of said power supply for re-applying said selected control voltage to said tuning element at a predetermined time subsequent to said energization of said power supply.

13. The apparatus of claim 12 wherein said means for re-applying said selected control voltage comprises timing means actuated when said plate is generated for defining a predetermined time period; second pulse generating means for generating a second pulse at the conclusion of said time period; and means responsive to said second pulse for re-applying said selected voltage representation to said control voltage generating means.

14. Frequency selecting apparatus comprised of programmable storage means for storing at addressable locations digital representations of respective plural broadcast frequencies to which a tuner included in said apparatus is adapted to be tuned; converting means for converting a selected representation read out from said storage means into a corresponding control voltage; a tuning element for receiving said control voltage to tune said tuner to said respective broadcast frequency; automatic fine tuning means for varying said selected representation read out from said storage means to correspondingly vary said control voltage until a predetermined frequency is pulled in by said tuner; read-out means for selectively reading out a predetermined digital representation from said storage means; and correction means coupled to said read-out means for re-activating said read-out means following a predetermined time delay to cause said read-out means again to read out said predetermined digital representation from said storage means so that if an unwanted frequency had been pulled in by the operation of said automatic fine tuning means, the varied previously read out representation is replaced by said predetermined digital representation which is converted into a corresponding control voltage.

15. The apparatus of claim 14 wherein said control voltage produced by said converting means gradually increases from an initial level to a control voltage level, said unwanted frequency corresponding to an instantaneous level of said control voltage; and wherein said read-out means comprises address generating means for generating an address of a predetermined location in said storage means; and read-out pulse generating means for applying a read-out pulse to said storage means for causing the digital representation stored at the addressed predetermined location to be read out therefrom.

16. The apparatus of claim 15 wherein said correction means comprises monostable multivibrator means normally exhibiting a quiescent state and being triggered to an active state for a predetermined time period when said read-out pulse is generated; differentiating means coupled to said monostable multivibrator means and responsive to the return of said monostable multivibrator means to its quiescent state from its active state to produce a pulse signal; and means for applying said pulse signal to said storage means as a second read-out pulse to cause said digital representation to be read out once again from said addressed predetermined location.

17. The apparatus of claim 16 wherein said address generating means is responsive to the initial energization of a power supply for said electronic tuner to generate a predetermined address; and said read-out pulse generating means comprises detecting means for detecting when said power supply is energized initially, and second differentiating means responsive to said detecting means for generating said read-out pulse.

18. The apparatus of claim 17 wherein said detecting means comprises an RC circuit connected in series across said power supply, and a transistor having its base electrode coupled to said RC circuit and its collector electrode coupled to said second differentiating means to supply said second differentiating means with a constant level signal while the capacitor in said RC circuit charges in response to the energization of said power supply and to supply said second differentiating means with a transition level when said capacitor discharges through the resistor in said RC circuit to reach a threshold level.

* * * * *